(12) United States Patent
Moliere et al.

(10) Patent No.: US 9,618,567 B2
(45) Date of Patent: Apr. 11, 2017

(54) METHODS AND DEVICES FOR STRESSING AN INTEGRATED CIRCUIT

(75) Inventors: Florian Moliere, Paris (FR); Sebastien Morand, Boulogne-Billancourt (FR); Alexandre Douin, Nanterre (FR); Gerard Salvaterra, Clamart (FR); Christian Binois, Francourville (FR); Daniel Peyre, St Remy les Chevreuse (FR)

(73) Assignee: EUROPEAN AERONAUTIC DEFENCE AND SPACE COMPANY EADS FRANCE, Blagnac (FR)

( * ) Notice: Subject to any disclaimer, the term of this patent is extended or adjusted under 35 U.S.C. 154(b) by 790 days.

(21) Appl. No.: 13/641,984

(22) PCT Filed: Apr. 19, 2011

(86) PCT No.: PCT/EP2011/056235
§ 371 (c)(1),
(2), (4) Date: Mar. 21, 2013

(87) PCT Pub. No.: WO2011/131669
PCT Pub. Date: Oct. 27, 2011

(65) Prior Publication Data
US 2013/0193995 A1 Aug. 1, 2013

(30) Foreign Application Priority Data

Apr. 20, 2010 (FR) ...................................... 10 52978

(51) Int. Cl.
*G01R 31/28* (2006.01)
(52) U.S. Cl.
CPC ..... *G01R 31/2863* (2013.01); *G01R 31/2874* (2013.01); *G01R 31/2898* (2013.01);
(Continued)

(58) Field of Classification Search
CPC ..... H01L 2924/351; H01L 2224/48091; H01L 2224/48247; H01L 2924/00014;
(Continued)

(56) References Cited

U.S. PATENT DOCUMENTS 3,774,078 A * 11/1973 Martin ............... H05K 7/20509
174/16.3
4,639,829 A 1/1987 Ostergren et al.
(Continued)

FOREIGN PATENT DOCUMENTS

EP 0 069 592 1/1983
JP 62 093965 4/1987

OTHER PUBLICATIONS

International Search Report dated Aug. 26, 2011, corresponding to PCT/EP2011/056235.
(Continued)

*Primary Examiner* — Huy Q Phan
*Assistant Examiner* — Adam Clarke
(74) *Attorney, Agent, or Firm* — Young & Thompson (57) ABSTRACT

Disclosed is in particular a device (2) for stressing an integrated circuit (1) including an electronic chip (10) mounted in a housing (12), the device including a source (20) of thermal stress. The device (2) also includes a thermally conductive coupling member (22), designed to be thermally coupled to the source (20) of thermal stress during the stressing operation. The coupling member (22) includes an end (220) whose geometry is suitable for being introduced into an aperture with a predefined geometry, to be made in the housing (12) of the integrated circuit (1) so as to thermally couple a coupling face (222) of this end (220) with a face (102) of the electronic chip (10).

14 Claims, 3 Drawing Sheets

(52) U.S. Cl.
CPC ............... *H01L 2224/48091* (2013.01); *H01L 2224/48247* (2013.01)

(58) Field of Classification Search
CPC ............ G01R 31/2863; G01R 31/2874; G01R 31/2898; G01N 21/9501; G01N 2223/6116
See application file for complete search history.

(56) References Cited

U.S. PATENT DOCUMENTS

| | | | |
|---|---|---|---|
| 5,045,914 A | | 9/1991 | Casto et al. |
| 5,164,661 A | * | 11/1992 | Jones ...................... 324/750.07 |
| 5,848,122 A | * | 12/1998 | Kurtz ................... G01R 31/265 378/79 |
| 5,895,972 A | * | 4/1999 | Paniccia ...................... 257/706 |
| 6,476,597 B1 | * | 11/2002 | Spratt et al. ............. 324/750.07 |
| 6,483,326 B1 | | 11/2002 | Bruce et al. |
| 6,607,928 B1 | * | 8/2003 | Eiles et al. ...................... 438/16 |
| 7,259,580 B2 | * | 8/2007 | Aube et al. .............. 324/750.09 |
| 8,248,097 B2 | * | 8/2012 | Ippolito et al. .......... 324/762.05 |
| 2003/0128809 A1 | * | 7/2003 | Umezawa ............... H01L 22/12 378/70 |
| 2009/0174427 A1 | | 7/2009 | Weinraub et al. |
| 2010/0124792 A1 | * | 5/2010 | Iravani ................. B24B 37/013 438/17 |
| 2011/0189925 A1 | * | 8/2011 | Iravani ................. B24B 37/013 451/5 |

OTHER PUBLICATIONS

"Backside Silicon Integrated Circuit Infrared Immersion Lens/Heat-Sink"; vol. 35, No. 7; Dec. 1, 1992; pp. 489-492.

\* cited by examiner

METHODS AND DEVICES FOR STRESSING AN INTEGRATED CIRCUIT

BACKGROUND OF THE INVENTION

Field of the Invention

The present invention relates to the field of integrated circuits analysis, and relates more specifically to the methods of analyzing the operation of integrated circuits subjected to thermal stresses.

Description of the Related Art

Before their implementation, integrated circuits are generally subjected to analysis procedures during which these integrated circuits are subjected in particular to stresses representative of operational stresses, i.e. stresses that they are likely to experience in their final environment.

These analysis procedures are particularly important, especially for integrated circuits that have to operate in high-stress environments, such as integrated circuits to be utilized in space and/or military missions, in aircrafts, in power plants, etc.

During an analysis procedure, it is common to subject the integrated circuit in operation to thermal stress, which corresponds for example to an operational thermal stress (thus referred to as an operational test) or thermal stress applied with the aim of accelerating the aging of said circuit (thus referred to as an aging test).

In order to apply thermal stress to an integrated circuit, it is known to place it, together with its test device, in a closed chamber equipped with a heating or cooling system.

"Test device" means the device in which the integrated circuit is mounted to check its operation during the analysis procedure. In particular, the test device comprises at least one printed circuit, called a "motherboard", on which the integrated circuit is mounted directly or indirectly by means for another printed circuit, called the "daughterboard", which interfaces with the motherboard.

Other electronic components are mounted on the test device, and it is understood that these components will be subjected to the same thermal stress. If there is a failure, it will be difficult to identify whether the problem comes from the integrated circuit tested, or another electronic component of the test device.

In order to limit the above-mentioned problem, it is known to mount the integrated circuit to be tested on a daughterboard, which is placed in the closed chamber, and to place the motherboard outside the chamber. However, this solution is not applicable for integrated circuits operating at very high frequencies (e.g. gigahertz for current SDRAM DDR3 memories). In effect, when the motherboard and daughterboard are separated, the propagation delay for signals over the interface between the motherboard and the daughterboard becomes far too large, a result of parasite capacities on this interface.

Another problem lies in the fact that the integrated circuits are generally in the form of an electronic chip, at least in part made of a semi-conductive material (silicon, germanium, gallium arsenide, etc.), encapsulated in a housing fitted with external connections (pins, ball grid array, etc.) electrically coupled to the electronic chip.

The thermal stress applied by means for the closed chamber relates to the ambient temperature inside this chamber. This thermal stress is therefore applied to the housing, which is characterized by its own thermal resistance. The temperature of the housing is different from the junction temperature of the electronic chip whereas, in practice, it is this junction temperature that one seeks to control.

SUMMARY OF THE INVENTION

The aim of this invention is to propose a solution making it possible to control the electronic chip's junction temperature without damaging nearby electronic components.

Another aim of the invention is to propose a solution that makes it possible to apply local thermal stress at the same time as radiation stress. Another aim of the invention is to propose a solution applicable to integrated circuits of different shapes and dimensions.

According to a first embodiment, the invention relates to a device for stressing an integrated circuit comprising an electronic chip mounted in a housing, said device comprising a source of thermal stress. In addition, the device comprises a thermally conductive coupling member, designed to be thermally coupled to the source of thermal stress during the stressing operation. The coupling member comprises an end whose geometry is adapted to be introduced into an aperture with a predefined geometry, to be made in the housing of the integrated circuit, so as to thermally couple a coupling face of this end with a face of the electronic chip.

Preferably, the coupling member has a substantially tapered external volume between two substantially parallel faces; one of these faces is the coupling face and the other, with a surface area substantially greater than said coupling face, is designed to be thermally coupled to the source of thermal stress.

Preferably, the device comprises means for determining structural characteristics of the integrated circuit and means for making the aperture in the housing according to said structural characteristics.

Preferably, the device comprises a plurality of coupling members with ends of different geometries.

Preferably, each coupling member comprises an internal duct emerging on the coupling face, adapted to provide optical access to the electronic chip when this coupling member's coupling face is applied against the electronic chip.

According to a second embodiment, the invention relates to a method for stressing an integrated circuit comprising an electronic chip mounted in a housing. The method comprises:
  a step of thermally coupling an end of a thermally conductive coupling member with a face of the electronic chip, by inserting said end into an aperture previously formed in the housing,
  a step of thermally stressing the electronic chip by means for a source of thermal stress thermally coupled to the coupling member.

Preferably, the method comprises a prior step of making the aperture by machining the housing.

Preferably, the method comprises a step of determining structural characteristics of the integrated circuit, the aperture in the housing being made according to said structural characteristics.

Preferably, the method comprises a step of selecting a coupling member, from a plurality of coupling members with ends of different geometries, suitable for being introduced into the aperture of the housing.

Preferably, the method comprises a step of radiation stressing the electronic chip through the aperture formed in the housing, preferably via an internal duct of the coupling member.

According to a third embodiment, the invention relates to a device for stressing an integrated circuit comprising an electronic chip thermally coupled to a heat sink accessible from the outside of a housing inside which said electronic chip is mounted. The device comprises a source of thermal stress and a thermally conductive coupling member, designed to be thermally coupled to the source of thermal stress and to an accessible part of the heat sink during the stressing operation.

Preferably, the device comprises a source of radiation stress and the coupling member has a geometry designed to maintain optical access to the heat sink, in which an aperture is to be formed in order to provide optical access to a face of the electronic chip for the radiation stressing operation.

Preferably, the stressing device comprises means for determining structural characteristics of the integrated circuit to be stressed and means for making the aperture in the heat sink according to said structural characteristics.

According to a fourth embodiment, the invention relates to a method for stressing an integrated circuit comprising an electronic chip thermally coupled to a heat sink accessible from the outside of a housing inside which said electronic chip is mounted. The method comprises:
- a step of thermally coupling a thermally conductive coupling member with an accessible part of the heat sink,
- a step of thermally stressing the electronic chip by means for a source of thermal stress thermally coupled to the coupling member.

Preferably, the method comprises a step of radiation stressing the electronic chip through an aperture previously formed in the heat sink; the coupling member maintaining optical access to said aperture in the heat sink.

Preferably, the method comprises a prior step of making the aperture by machining the heat sink of the integrated circuit.

Preferably, the method comprises a step of determining structural characteristics of the integrated circuit, the aperture in the heat sink being formed according to said structural characteristics.

BRIEF DESCRIPTION OF THE DRAWING FIGURES

The invention will be better understood by reading the following description of a non-limiting example, made with reference to the figures, which represent.

DETAILED DESCRIPTION OF THE INVENTION

This invention relates to the stressing operations of integrated circuits, and it relates more specifically to thermal stressing accompanied, in some cases, by radiation stress.

"Radiation stress" means any known type of radiation for stressing integrated circuits. For example, it consists of photon radiation (laser, X-ray, gamma, etc.) and/or ionizing radiation (alpha, protons, neutrons, heavy ions, etc.).

The invention is applicable to any integrated circuit comprising an electronic chip mounted inside a housing fitted with external connections.

The invention is therefore applicable to very different forms of electronic components, in particular through-hole mounted (DIL, etc.), or surface-mounted with pins (SS-OPOJ, PLCC, SOP, QFP, etc.), ball grid array (or BGA), etc.

The invention is also independent of the technology utilized for electronically coupling the electronic chip to external connections, and can be applied to wired cabling ("bonding") or flip-chip circuits.

The invention is therefore applicable to electronic circuits with very different functions (analog components, digital components, power components, electronic memories, microprocessors, etc.). By misuse of language, discrete components are also included in the category of integrated circuits.

Figure 1A:
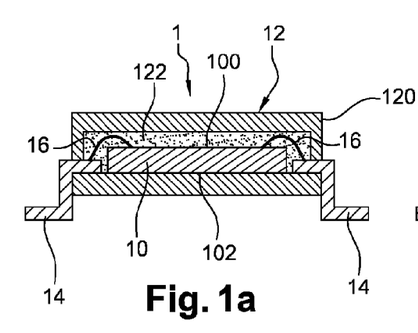
FIGS. 1a and 1b: schematic representations of cross-sections of examples of integrated circuits.

FIG. 1a represents, very schematically, a cross-section of a first example of an integrated circuit 1, of the wired cabling ("bonding") type.

The integrated circuit 1 comprises an electronic chip 10 made of semi-conductive material (silicon, germanium, gallium arsenide, etc.).

The electronic chip 10 is substantially in the form of a plate comprising two opposite faces. In principle one of the faces, referred to as the "working face", 100 bears the electronic circuits. The opposite face, referred to as the "non-working face", 102 does not bear electronic circuits and generally corresponds to the substrate of the electronic chip 10.

The electronic chip 10 is mounted in a housing 12.

In the context of the invention, "housing" 12 means any element preventing mechanical access to the electronic chip 10. For example, the housing includes an external shell 120, an encapsulation resin 122, etc.

In the rest of the description, "interior" of the housing 12 means the part of the housing in which the electronic chip 10 is located. The exterior of the housing 12 is, in contrast, the part of the housing in which said electronic chip is not located.

Seen from the exterior, the housing 12 mainly comprises two front faces connected to each other by one or more side faces. The front faces are substantially parallel to the faces of said electronic chip.

The integrated circuit 1 comprises external connections 14 (pins), which are electrically connected to the inputs/outputs of the electronic chip 10 by connecting wires 16.

Figure 1B:
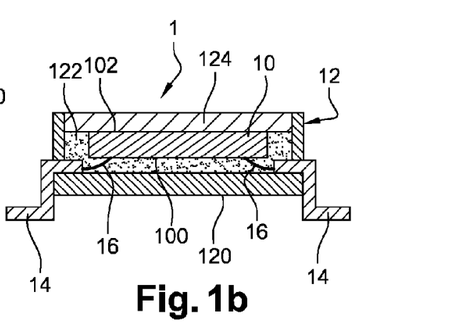

FIG. 1b represents, very schematically, a cross-section of a second example of integrated circuit 1, comprising substantially the same elements as that shown in FIG. 1a.

The integrated circuit 1 of FIG. 1b differs by the presence of a heat sink 124, thermally coupled to the non-working face 102 of the electronic chip 10, and by the fact that its electronic chip is inverted.

The heat sink 124 is at least partially accessible from the exterior of the housing 12. In the example of FIG. 1b, the heat sink 124 forms one of the front faces of the housing 12.

Figure 2:
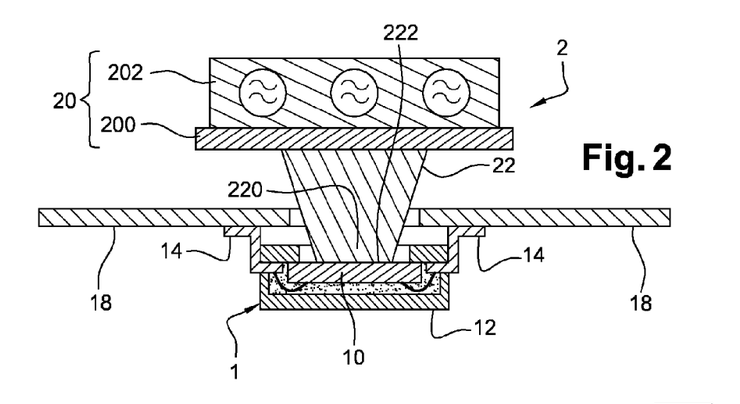
FIG. 2: a schematic representation of a cross-section of an example of a stressing device according to a first embodiment.

FIG. 2 represents a preferred embodiment of a device 2 for stressing an integrated circuit 1.

According to this preferred embodiment, the device 2 comprises a source 20 of thermal stress, which can be of any known type.

Preferably, the source 20 of thermal stress comprises a thermoelectric module 200, such as a Peltier module.

A Peltier module generally comprises two opposed faces. When it is supplied with power, one of its faces, called the "hot face", will get hotter while the other face, called the "cold face", will get colder.

Preferably, the source 20 of thermal stress also comprises a thermal control module 202, which can be of any known type. For example, it consists of a thermal control module with a circulating heat transfer fluid (water, oil, etc.), utilized to control the temperature of one face of the Peltier module, the cold face if it is desired to apply high-temperature stress to the integrated circuit 1.

The stressing device 2 also comprises a control module, not shown in the figures, which controls the operation of the source 20 of thermal stress.

The control module comprises for example a microcomputer linked to storage means (magnetic hard disk, RAM and/or ROM memory, optical disk, etc.) by a communication bus. A computer program product is stored in the storage means, in the form of a set of program code instructions, which, when executed by the microcomputer, allow the temperature applied by the source 20 of thermal stress to be controlled. According to certain embodiments, the control module also comprises specialized electronic circuits of ASIC, FGPA, etc. type.

The device 2 also comprises a coupling member 22. The coupling member 22 comprises a connection area designed to be thermally coupled to the source 20 of thermal stress during the stressing of the integrated circuit 1.

The coupling member 22 is wholly or partially made of thermally conductive material, e.g. copper or copper alloy, aluminum or aluminum alloy, etc. The coupling member 22 is thermally conductive between the area of connection to the source 20 of thermal stress and an end 220.

The end 220 of the coupling member 22 is adapted, by its geometry, to be introduced into an aperture previously formed in the housing 12 of the integrated circuit 1 to be stressed; said aperture allows mechanical access to one face of the electronic chip 10. "Geometry" of the end 220 means its external volume, i.e. its shape and dimensions. "Mechanical access to a face of the electronic chip" means that a coupling member whose end has a geometry designed to be introduced into said aperture can abut said face of the electronic chip 10.

The aperture previously formed in the housing 12 makes it possible to mechanically access all or part of a face of the electronic chip 10, with which a coupling face 222 of the end 220 is thermally coupled during the stressing of the integrated circuit 1.

The coupling face 222 preferably substantially complements the face of the electronic chip 10 with which it must be thermally coupled, in particular when the coupling face 222 is intended to abut said face of the electronic chip 10.

Preferably, the coupling face 222 is designed to be thermally coupled to the non-working face 102 of the electronic chip 10. This is the case considered in the rest of the description. In addition, the case is considered in which the non-working face 102 is substantially flat and the coupling face 222 is also substantially flat.

It should be noted that nothing precludes, according to other examples, the end 220 of the coupling member 22 from being coupled to the working face 100 of the electronic chip 10. However, in practice this proves to be complicated because of the risk of short-circuits (in the case in which the coupling member 22 is made of an electrically conductive material) and/or the risk of damaging the electronic circuits of the working face 100. In addition, when the working face 100 is partially covered by intermetallic oxides, thermal conduction between the coupling face 22 and the electronic chip 10 may be insufficient.

The coupling between, firstly, the coupling member 22 and the source 20 of thermal stress and, secondly, the coupling face 222 of said coupling member and the electronic chip 10, may be direct or indirect. In the case of direct coupling, this is achieved without intermediate elements; the elements coupled thermally are thus in contact with each other. In the case of indirect coupling, this is achieved through one or more other intermediate elements, all thermally conductive and coupled directly. For example, by using thermal grease and/or a thin plate made of sapphire (designed, where necessary, to be introduced into an aperture previously formed in the housing 12). It is noted that the ambient air is not an intermediate element allowing an indirect thermal coupling insofar as the ambient air is a thermal insulator.

Preferably, the coupling member 22 is a solid body, to ensure uniform diffusion of the thermal stress. Nothing precludes, according to other embodiments, some of which will be described with reference to FIGS. 4a and 4b, the coupling member 22 from comprising one or more internal cavities, one or more internal ducts, etc.

In a preferred embodiment, illustrated by FIG. 2, the coupling member 22 has a substantially tapered external volume between two substantially parallel faces. One of these faces is the coupling face 222 and the other corresponds to the connection area of the coupling member 22. The connection area has a surface area greater than that of said coupling face in order to increase the surface area available for thermal coupling to the source 30 of thermal stress.

Figure 3A:
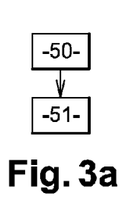
FIGS. 3a to 3e: diagrams illustrating implementation examples of a stressing method according to the invention.

FIG. 3a represents the main steps of a method for stressing an integrated circuit 1 implementing the device 2.

As shown in FIG. 3a, the stressing method mainly comprises the following steps:

- a step 50 of thermally coupling the end 220 of the coupling member to the non-working face 102 of the electronic chip 10, by inserting said end 220 into an aperture previously formed in the housing 12.
- a step 51 of thermally stressing the electronic chip 10 of the integrated circuit 1, during which a temperature is applied to the electronic chip 10 by means for the source 20 of thermal stress, thermally coupled to the coupling member 22.

The device 2 preferably comprises means for making the aperture in the housing 12, not shown in the figures. The means for making an aperture in the housing are, for example, in the form of a machine-tool designed to machine the housing 12 (milling machine, etc.). These means must be sufficiently accurate to allow the electronic chip 10 of the integrated circuit 1 to be exposed without damaging it.

Preferably it is a digitally controlled machine-tool, adapted to make apertures of different shapes and/or dimensions, according to given instructions. The machine-tool is, for example, mounted on means enabling it to be moved (articulated robot, motorized translation units, etc.) and/or the machine-tool comprises a plurality of interchangeable machining heads with different geometries.

Figure 3B:
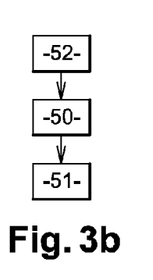

As shown in FIG. 3b, in this case the stressing method comprises a prior step 52 of making the aperture in the housing 12 of the integrated circuit 1, so as to expose all or part of said non-working face 102, and thus enable mechanical access to said non-working face.

It should be noted that, as the integrated circuit 1 is generally mounted on a printed circuit 18, it may be necessary to provide or to form an aperture in this printed circuit.

Figure 4A:
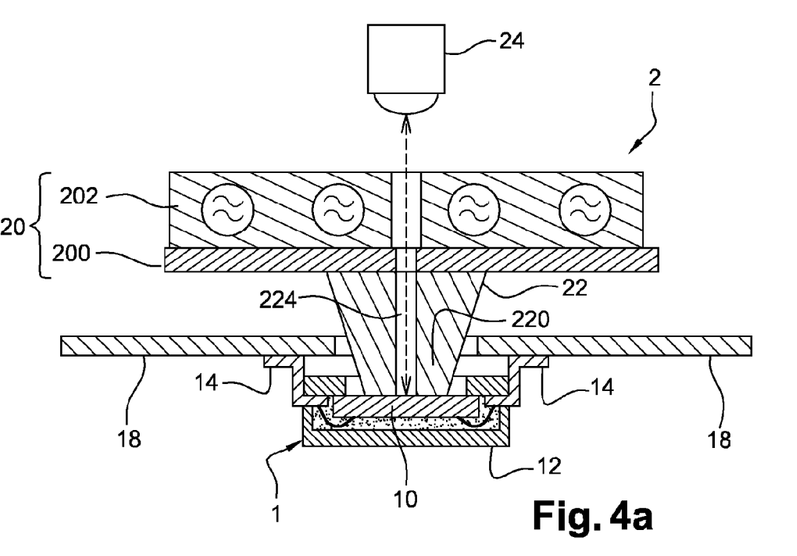
FIGS. 4a and 4b: schematic representations of cross-sections of embodiment variants of the device of FIG. 2, FIG. 5: a schematic representation of a cross-section of an example of a stressing device according to a second embodiment.
Figure 4B:
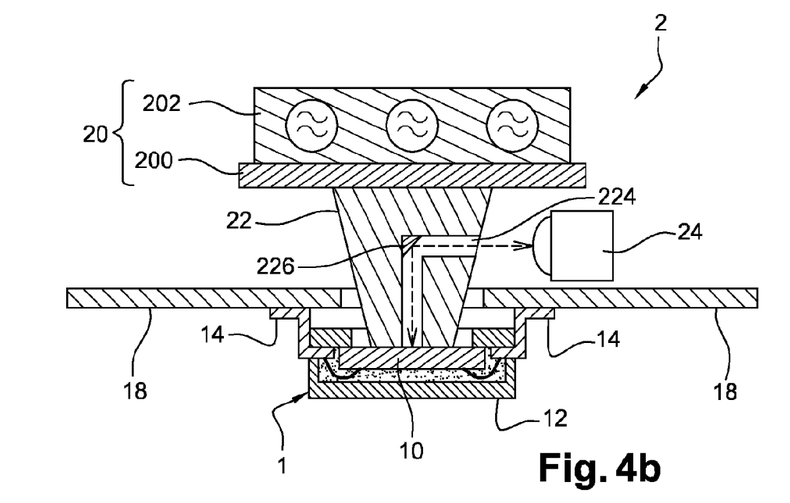

For example, if the integrated circuit 1 is of the wired cabling ("bonding") type, the non-working face 102 will generally be on the printed circuit side, and will only be accessible if an aperture is provided or formed in this printed circuit. This case is illustrated by FIGS. 2, 4a and 4b.

Nothing precludes the aperture in the printed circuit 18 from being formed at the same time as the aperture in the housing 12, i.e. during the same machining operation executed after the integrated circuit 1 has been mounted on the printed circuit 18. Preferably, the printed circuit 18 and the housing 12 are opened separately; in particular the aperture in the printed circuit 18 is made before mounting the integrated circuit 1 on this printed circuit.

When the printed circuit 1 is a flip-chip, the non-working face 102 will generally be on the side opposite the printed circuit 18, and it will therefore not be necessary to make an aperture in this printed circuit.

It is understood that the prior making of an aperture in the housing 12 of the integrated circuit 1 and the use of the coupling member 22 with a suitable geometry ensures that the thermal stress, generated by the source 20 of thermal stress, is transmitted to the electronic chip 10. This thus ensures better control of said electronic chip's junction temperature.

Advantageously, the geometry of the aperture made is determined according to structural characteristics of the integrated circuit. "Geometry of the aperture" means the volume to be machined in the housing, i.e. its shape and dimensions, to provide total or partial mechanical access to the non-working face 102 of the electronic chip 10.

"Structural characteristics of the integrated circuit" means at least one of the following characteristics: the shape of the electronic chip 10, the dimensions of the non-working face 102 of the electronic chip 10, the thickness of the housing 12, the internal configuration of the integrated circuit 1 (in order to determine in particular which of the front faces must be machined to provide mechanical access to the non-working face 102 of the chip 10), etc.

In a variant, the stressing device 2 comprises means for determining the structural characteristics of the integrated circuit 1. These means are not shown in the figures.

Preferably, the means for determining structural characteristics comprise a non-destructive control module, for example an X-ray module.

Figure 3C:
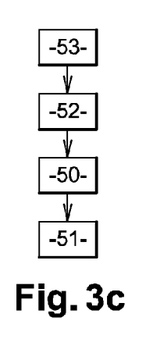

As shown in FIG. 3c, in this case the stressing method comprises a step 53 of determining structural characteristics of the integrated circuit 1 to be stressed, prior to the step 52 of making the aperture.

According to a variant, the device 2 comprises a plurality of coupling members 22 whose ends 220 have different geometries. Preferably, these coupling members 22 are interchangeable, i.e. they can be coupled in turn to the source 20 of thermal stress.

Figure 3D:
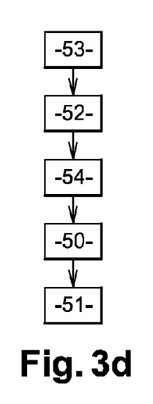

As shown in FIG. 3d, in this case the stressing method comprises a step 54 of selecting a coupling member 22, from the plurality of coupling members 22, suitable for stressing the integrated circuit 1.

The coupling member 22 is selected according to the geometry of the aperture, insofar as the coupling member 22 selected must be suitable for being introduced into the aperture formed in the housing.

Preferably, the coupling member 22 is also selected based on structural characteristics of the integrated circuit 1.

For example, the selection consists of identifying, from amongst the available coupling members 22, the coupling member 22 that is suitable for being inserted into the aperture formed and at the same time maximizes the contact area (and therefore the thermal transfer surface area) with the non-working face 102.

It is understood that such a device 2 may be used for stressing integrated circuits with different structural characteristics.

In a variant, the device 2 also comprises a source 24 of radiation stress, of known type, such as a laser source.

Figure 3E:
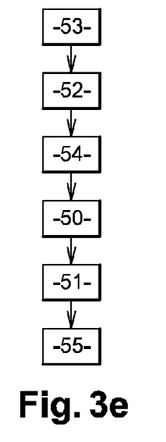

As shown in FIG. 3e, in this case, the stressing method comprises a step 55 of radiation stressing the electronic chip 10, during which radiation is applied to the electronic chip 10 through the aperture formed in the housing 12.

It should be noted that thermal stressing step 50 and radiation stressing step 55 are preferably executed simultaneously.

Preferably, each coupling member 22 comprises an internal duct 224 emerging on the coupling face 222 of its end, adapted to provide optical access to the electronic chip 10 when the coupling face 222 of this coupling member is applied against the non-working face 102 of the electronic chip 10.

"Optical access" means an access designed to let radiation stress, e.g. a laser beam, pass through to the electronic chip 10.

This optical access, provided by the internal duct 224 of a coupling member 22, allows the radiation stress to be applied to the electronic chip 10 of the integrated circuit 1, through the coupling member.

FIGS. 4a and 4b show, schematically, example embodiments of a coupling member 22 comprising an internal duct 224.

In FIG. 4a, the internal duct 224 is substantially rectilinear and emerges in the area of connection to the source 20 of thermal stress. In the non-limiting example illustrated by FIG. 4a, the thermoelectric module 200 also comprises an aperture, in the extension of the internal duct 224, for applying the radiation stress through the thermoelectric module 200.

In FIG. 4b, the internal duct 224 comprises two communicating parts, joined together to form a substantially right angle. A reflective element 226, such as a mirror, is arranged at the junction. The reflective element 226 is oriented substantially at 45 degrees such that, particularly in the case of a laser beam, an incident laser beam in a first part of the internal duct 224 is reflected in the direction of the second part of the internal duct 224.

Figure 5:
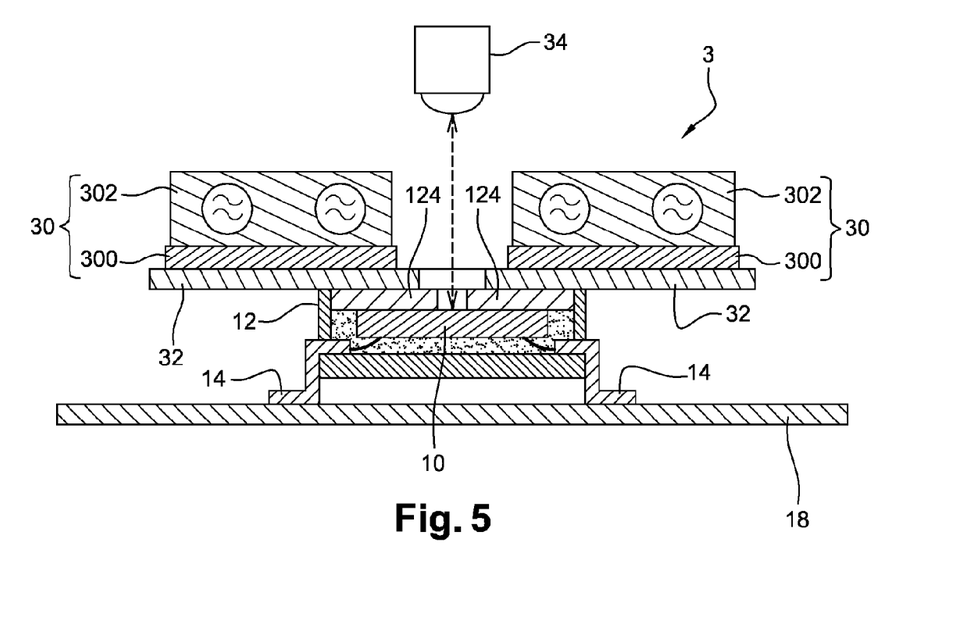

FIG. 5 represents a second preferred embodiment of a device 3 for stressing an integrated circuit 1 comprising a heat sink 124.

In this second embodiment, the device 3 comprises a source 30 of thermal stress and a thermally conductive coupling member 32, designed to be thermally coupled to the source 30 of thermal stress during the stressing operation, and to an accessible part of the heat sink 124 of the integrated circuit 1.

It is understood that, by applying the thermal stress to the heat sink 124, whose function is normally to evacuate the heat generated by the electronic chip 10 in operation, better control of said electronic chip's junction temperature is ensured.

The coupling between the coupling member 32 and the source 30 of thermal stress may be direct or indirect. In the case of direct coupling, this is achieved without intermediate elements; the coupling member 32 and the source 30 of thermal stress are thus in contact with each other. In the case of indirect coupling, this is achieved through one or more other intermediate elements, all thermally conductive and coupled directly to each other.

Preferably, the source 30 of thermal stress comprises a thermoelectric module 300 and a thermal control module 302.

The device 3 also comprises a control module, not shown in the figures. The control module comprises for example a microcomputer linked to storage means (magnetic hard disk, RAM and/or ROM memory, optical disk, etc.) by a communication bus. A computer program product is stored in the storage means, in the form of a set of program code instructions, which, when executed by the microcomputer, allow control of the stresses applied, in particular control of the temperature applied by the source 30 of thermal stress. According to certain embodiments, the control module also comprises specialized electronic circuits of ASIC, FGPA, etc. type.

Figure 6:
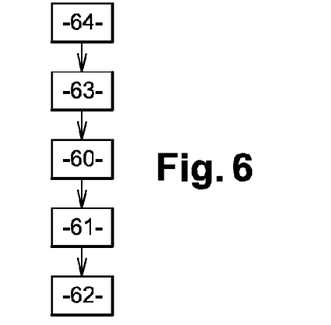
FIG. 6: a diagram illustrating an example of the method implementing the device of FIG. 5.

FIG. 6 shows the steps of an example of a method utilizing the device 3 according to the second preferred embodiment. The method mainly comprises:
- a step 60 of thermally coupling the coupling member 32 with the accessible part of the heat sink 124,
- a step 61 of thermally stressing the electronic chip 10, during which a temperature is applied to the electronic chip 10 by means for the source 30 of thermal stress, thermally coupled to the coupling member 32.

Preferably, the device 3 also comprises a source 34 of radiation stress and the method comprises a step 62 of radiation stressing the electronic chip 10, during which radiation is applied to the electronic chip 10 through the aperture previously formed in the heat sink 124 of the integrated circuit 1.

It should be noted that thermal stressing step 61 and radiation stressing step 62 are preferably executed simultaneously.

The geometry of the coupling member 32 is designed to maintain optical access to an aperture previously formed in the heat sink 124 of the integrated circuit 1; said aperture provides optical access to the non-working face 102 of the electronic chip 10.

In other words, when the coupling member 32 is thermally coupled to the heat sink, it does not screen the aperture formed in the heat sink 124, so that optical access to the non-working face 102 of the electronic chip 10 is maintained.

In the example shown in FIG. 5, the coupling member 32 is substantially in the form of a plate with an aperture of sufficient dimensions to maintain optical access to the aperture in the heat sink 124. According to other examples, the coupling member 32 is made wholly or partially in a translucent material (glass, sapphire if the translucent material must also be thermally conductive, etc.), in which radiation formed by the source 34 of radiation stress can propagate.

Preferably, the dimensions of the coupling member 32, in particular its length and width in the case of a plate, are greater than those of the heat sink 124. In this way, the surface area available for thermal coupling with the source 30 of thermal stress is increased. In addition, the source 30 of thermal stress can then be away from the aperture in the heat sink 124, which contributes to maintaining optical access to the electronic chip 10.

Preferably, the device 3 comprises means for making the aperture in the heat sink 124. These means are utilized to expose all or part of the non-working face 102 of the electronic chip 10 and provide optical access for applying radiation stress.

In this case, the method comprises a prior step 63 of making the aperture in the heat sink 124.

Advantageously, the geometry of the aperture made is determined according to structural characteristics of the integrated circuit 1. Preferably, the device 3 also comprises means for determining structural characteristics of the integrated circuit, not shown in FIG. 5.

In this case, the stressing method comprises a step 64 of determining structural characteristics of the integrated circuit 1 to be stressed.

It should be noted that the dimensions of the aperture are preferably limited to the dimensions required to let the incident radiation pass. In effect, the dimensions of the aperture must be minimized in order to maximize the heat exchange surface between, firstly, the heat sink 124 and the coupling member 32 and, secondly, the heat sink 124 and the electronic chip 10. Advantageously, the dimensions of the aperture are of the order of the millimeter.

More generally, the scope of this invention is not limited to the modes of implementation and embodiments considered above as non-limiting examples, but on the contrary extends to all modifications in the reach of the man skilled in the art.

In particular, it is understood that the thermal stress applied can be high-temperature stress or low-temperature stress. This is achieved, for example, by reversing the polarity of the Peltier module. The thermal control module regulates the temperature of the cold face in the case of a high-temperature stressing operation and the hot face in the case of a low-temperature stressing operation.

It is noted that the invention relates to analyzing the behavior of an integrated circuit when it is subjected to stress, notably thermal stress. The various steps of thermal stressing methods are generally followed by steps of exciting the integrated circuit and analyzing the behavior of said integrated circuit to determine the impact of the stresses applied. These steps are considered to be known to the person skilled in the art, and are not shown in the figures.

In addition, the control module, which controls the operation of the source of thermal stress and, where appropriate, the source of radiation stress, is then configured to analyze the behavior of the integrated circuit in response to the stresses applied.

The invention claimed is:

1. A device for stressing an integrated circuit, wherein the integrated circuit to be stressed comprises an electronic chip in semi-conductive material and a housing, said electronic chip being mounted inside said housing such that said housing prevents mechanical access to the electronic chip, the device comprising:
a non-destructive control module for determining structural characteristics of the integrated circuit;
a machine-tool for machining an aperture in the housing of the integrated circuit, said aperture being machined according to the structural characteristics determined by the non-destructive control module so as to allow mechanical access to a face of the electronic chip;

a thermally conductive coupling member, designed to be thermally coupled to a source of thermal stress during the stressing operation; and the coupling member comprises an end whose geometry is suitable for being introduced into the aperture to be made in the housing of the integrated circuit, so as to thermally couple a coupling face of this end with said face of the electronic chip.

2. The device according to claim 1, wherein the coupling member has a substantially tapered external volume between two substantially parallel faces; one of these faces is the coupling face and the other, with a surface area substantially greater than said coupling face, is designed to be thermally coupled to the source of thermal stress during the stressing operation.

3. The device according to claim 2, further comprising a plurality of coupling members whose ends have different geometries.

4. The device according to claim 1, further comprising a plurality of coupling members whose ends have different geometries.

5. The device according to claim 1, wherein each coupling member comprises an internal duct emerging on the coupling face of its end, adapted to provide optical access to the electronic chip when the coupling face of this coupling member is applied against the non-working face of the electronic chip.

6. The device according to claim 1, wherein the non-destructive control module is an X-ray module.

7. A method for stressing an integrated circuit, wherein the integrated circuit to be stressed comprising an electronic chip in semi-conductive material and a housing, said electronic chip being mounted inside said housing such that said housing prevents mechanical access to the electronic chip, the method comprising:
  a step of determining structural characteristics of the integrated circuit by a non-destructive control module;
  a step of machining an aperture in the housing of the integrated circuit by a machine-tool, said aperture being machined according to the structural characteristics determined by the non-destructive control module so as to allow mechanical access to a face of the electronic chip;
  a step of thermally coupling an end of a thermally conductive coupling member with the face of the electronic chip, by inserting said end into the aperture formed in the housing; and
  a step of thermally stressing the electronic chip by means for a source of thermal stress thermally coupled to the coupling member.

8. The method according to claim 7, further comprising a step of selecting a coupling member, from a plurality of coupling members with ends of different geometries, adapted to be introduced into the aperture of the housing.

9. The method according to claim 7, further comprising a step of radiation stressing the electronic chip through the aperture formed in the housing of the integrated circuit, preferably via an internal duct of the coupling member; said internal duct emerges on the coupling face of the end of the coupling member.

10. The method according to claim 7, wherein the non-destructive control module is an X-ray module.

11. A device for stressing an integrated circuit the device comprising a source of thermal stress and a source of radiation stress, wherein the integrated circuit to be stressed comprises an electronic chip in semi-conductive material, a heat sink and a housing, said electronic chip being mounted inside the housing and being thermally coupled to said heat sink which is accessible from the exterior of said housing, the device comprising:
  a non-destructive control module for determining structural characteristics of the integrated circuit;
  a machine-tool for machining an aperture in the heat sink of the integrated circuit, said aperture being machined according to the structural characteristics determined by the non-destructive control module so as to provide optical access to a face of the electronic chip; and
  a thermally conductive coupling member, designed to be thermally coupled to the source of thermal stress and to an accessible part of the heat sink during the stressing of the integrated circuit, wherein
  the coupling member has a geometry designed to maintain optical access to the aperture in the heat sink for the radiation stressing operation.

12. The device according to claim 11, wherein the non-destructive control module is an X-ray module.

13. A method for stressing an integrated circuit, wherein the integrated circuit to be stressed comprises an electronic chip in semi-conductive material, a heat sink and a housing, said electronic chip being mounted inside the housing and being thermally coupled to said heat sink which is accessible from the exterior of said housing,
the method comprising:
  a step of determining structural characteristics of the integrated circuit by a non-destructive control module;
  a step of machining an aperture in the housing of the integrated circuit by a machine-tool, said aperture being machined according to the structural characteristics determined by the non-destructive control module so as to allow mechanical access to a face of the electronic chip;
  a step of thermally coupling a thermally conductive coupling member with an accessible part of the heat sink;
  a step of thermally stressing the electronic chip by a source of thermal stress thermally coupled to the coupling member; and
  a step of radiation stressing the face of the electronic chip through the aperture formed in the heat sink; the coupling member maintaining optical access to said aperture in the heat sink.

14. The method according to claim 13, wherein the non-destructive control module is an X-ray module.

* * * * *

UNITED STATES PATENT AND TRADEMARK OFFICE
CERTIFICATE OF CORRECTION

PATENT NO. : 9,618,567 B2  
APPLICATION NO. : 13/641984  
DATED : April 11, 2017  
INVENTOR(S) : Florian Moliere et al.

Page 1 of 1

It is certified that error appears in the above-identified patent and that said Letters Patent is hereby corrected as shown below:

On the Title Page

Left column:
"(73) Assignee: EUROPEAN AERONAUTIC DEFENCE AND SPACE COMPANY EADS FRANCE, BLAGNAC (FR)"
Should be replaced with:
--(73) Assignee: AIRBUS GROUP SAS, BLAGNAC (FR)--.

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*